(12) United States Patent
Santoruvo et al.

(10) Patent No.: US 9,012,810 B2
(45) Date of Patent: Apr. 21, 2015

(54) HEATING ELEMENT FOR MICROFLUIDIC AND MICROMECHANICAL APPLICATIONS

(75) Inventors: Gaetano Santoruvo, San Diego, CA (US); Stefano Lo Priore, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 1879 days.

(21) Appl. No.: 11/739,543

(22) Filed: Apr. 24, 2007

(65) Prior Publication Data

US 2007/0284360 A1 Dec. 13, 2007

Related U.S. Application Data

(63) Continuation of application No. 10/029,533, filed on Dec. 20, 2001, now abandoned.

(51) Int. Cl.
*H05B 1/00* (2006.01)
*H05B 3/28* (2006.01)
(Continued)

(52) U.S. Cl.
CPC ............... *H05B 3/28* (2013.01); *B01J 19/0093* (2013.01); *B01J 2219/00783* (2013.01); *B01J 2219/00873* (2013.01); *B01L 3/5027* (2013.01); *B01L 7/52* (2013.01); *B41J 2/14129* (2013.01);
(Continued)

(58) Field of Classification Search
CPC .... H05B 3/28; H01L 2924/00; H01L 23/345; H01L 27/1203; H01L 29/78; B01L 3/5027; B01L 7/52; B41J 2202/13; B41J 2/14129

USPC ........ 219/209, 200, 201, 202, 203, 204, 205, 219/206, 207, 208, 210, 439; 257/510; 438/282
See application file for complete search history.

(56) References Cited

U.S. PATENT DOCUMENTS 3,308,271 A  3/1967  Hilbiber ........................ 219/501
3,632,970 A  1/1972  Walkow et al. ............... 219/216
(Continued)

FOREIGN PATENT DOCUMENTS

EP  0 798 561  10/1997
EP  0 895 276  2/1999
(Continued)

OTHER PUBLICATIONS

Askeland, R. et al., "The Second-Generation Thermal Inkjet Structure," *Hewlett-Packard Journal*, pp. 28-31, Aug. 1988.
(Continued)

*Primary Examiner* — Sang Y Paik
(74) *Attorney, Agent, or Firm* — Seed IP Law Group PLLC

(57) ABSTRACT

An integrated heater formed as a field effect transistor in a semiconductor substrate, with the transistor having source and drain regions with a channel region extending therebetween to conduct current. The channel region has a resistance when conducting current to generate heat above a selected threshold. A dielectric layer is disposed on the channel region and a gate electrode is disposed on the dielectric layer to control the current of the channel region. A thermally insulating barrier is formed in the semiconductor material and may extend about the transistor. The object to be heated is positioned to receive the heat generated by the resistance of the channel region; the object may be a fluid chamber.

30 Claims, 9 Drawing Sheets

(51) Int. Cl.
*B01J 19/00* (2006.01)
*B41J 2/14* (2006.01)
*H01L 27/12* (2006.01)
*H01L 29/06* (2006.01)
*H01L 29/78* (2006.01)
*B01L 3/00* (2006.01)
*B01L 7/00* (2006.01)
*H01L 23/34* (2006.01)

(52) U.S. Cl.
CPC ............ *B41J2202/13* (2013.01); *H01L 23/345* (2013.01); *H01L 27/1203* (2013.01); *H01L 29/0657* (2013.01); *H01L 29/78* (2013.01); *H01L 2924/0002* (2013.01)

(56) References Cited

U.S. PATENT DOCUMENTS

| | | | |
|---|---|---|---|
| 3,694,622 A | 9/1972 | Bentley .................... 219/213 |
| 3,852,563 A | 12/1974 | Bohorquez et al. ........... 219/216 |
| 3,982,093 A | 9/1976 | Henrion .................... 219/216 |
| 4,035,607 A | 7/1977 | Wu ........................ 219/216 |
| 4,041,276 A | 8/1977 | Schwarz et al. ............. 219/308 |
| 4,157,466 A | 6/1979 | Herrin .................... 219/210 |
| 4,374,316 A | 2/1983 | Inamori et al. ............. 219/209 |
| 4,723,835 A | 2/1988 | Franklin ................. 350/331 R |
| 4,888,624 A | 12/1989 | Johnston, Jr. et al. ........ 357/16 |
| 4,935,752 A | 6/1990 | Hawkins .................. 346/140 |
| 4,996,487 A * | 2/1991 | McSparran et al. .......... 324/549 |
| 5,208,472 A | 5/1993 | Su et al. ................ 257/344 |
| 5,243,212 A * | 9/1993 | Williams ................. 257/344 |
| 5,429,734 A | 7/1995 | Gajar et al. ............. 204/299 R |
| 5,532,901 A | 7/1996 | Hawkins et al. ............ 361/212 |
| 5,604,519 A * | 2/1997 | Keefe et al. .............. 347/13 |
| 5,639,423 A | 6/1997 | Northrup et al. ........... 122/50 |
| 5,644,676 A | 7/1997 | Blomberg et al. ........... 392/407 |
| 5,681,997 A | 10/1997 | McHale et al. ............ 73/727 |
| 5,690,841 A | 11/1997 | Elderstig ................ 216/39 |
| 5,716,842 A | 2/1998 | Baier et al. ............ 435/283.1 |
| 5,760,804 A | 6/1998 | Heinzl et al. ............ 347/56 |
| 5,858,195 A | 1/1999 | Ramsey .................. 204/601 |
| 5,883,412 A | 3/1999 | Ferla et al. ............. 257/341 |
| 5,960,014 A | 9/1999 | Li et al. ................ 372/20 |
| 6,001,229 A | 12/1999 | Ramsey .................. 204/451 |
| 6,010,607 A | 1/2000 | Ramsey .................. 204/435 |
| 6,010,608 A | 1/2000 | Ramsey .................. 204/453 |
| 6,034,410 A | 3/2000 | Chan et al. .............. 257/510 |
| 6,046,433 A | 4/2000 | Gross et al. ............. 219/209 |
| 6,071,478 A | 6/2000 | Chow ..................... 422/81 |
| 6,091,082 A | 7/2000 | Thomas et al. ............ 257/77 |
| 6,111,280 A | 8/2000 | Gardner et al. |
| 6,114,658 A | 9/2000 | Roth et al. .............. 219/209 |
| 6,140,672 A | 10/2000 | Arita et al. ............. 257/295 |
| 6,160,243 A * | 12/2000 | Cozad .................... 219/439 |
| 6,211,066 B1 | 4/2001 | Stumborg et al. .......... 438/627 |
| 6,270,192 B1 * | 8/2001 | Ma ........................ 347/45 |
| 6,319,469 B1 | 11/2001 | Mian et al. ............. 422/64 |
| 6,368,871 B1 | 4/2002 | Christel et al. ........... 436/180 |
| 6,403,367 B1 | 6/2002 | Cheng et al. ............ 435/287.1 |
| 6,412,919 B1 | 7/2002 | Ghozeil et al. ............ 347/57 |
| 6,440,725 B1 | 8/2002 | Pourahmadi et al. ...... 435/288.5 |
| 6,453,883 B2 | 9/2002 | Schreckenberger .......... 123/509 |
| 6,485,132 B1 | 11/2002 | Hiroki et al. ............ 347/65 |
| 6,504,226 B1 * | 1/2003 | Bryant ................... 257/510 |
| 6,512,203 B2 | 1/2003 | Jones et al. ............. 219/219 |
| 6,536,877 B2 | 3/2003 | Miyamoto et al. .......... 347/58 |
| 6,624,065 B2 * | 9/2003 | Jang et al. .............. 438/633 |
| 6,673,593 B2 | 1/2004 | Mastromatteo et al. ... 435/283.1 |
| 6,689,627 B2 | 2/2004 | Mottura et al. ........... 438/24 |
| 6,710,311 B2 | 3/2004 | Villa et al. ............. 219/521 |
| 6,770,471 B2 | 8/2004 | Barlocchi et al. ......... 435/287.2 |
| 6,864,140 B2 | 3/2005 | Bryant ................... 438/282 |
| 2003/0017660 A1 | 1/2003 | Li ....................... 438/174 |
| 2003/0038124 A1 | 2/2003 | Krieger et al. ........... 219/209 |
| 2003/0190632 A1 * | 10/2003 | Sosnowski et al. ........... 435/6 |

FOREIGN PATENT DOCUMENTS

| | | |
|---|---|---|
| GB | 2 325 464 | 11/1998 |
| WO | WO 94/21372 | 9/1994 |
| WO | WO 98/32009 A1 | 7/1998 |
| WO | WO 98/50773 | 11/1998 |
| WO | WO 00/23190 | 4/2000 |

OTHER PUBLICATIONS

Baker, J. et al., "Design and Development of a Color Thermal Inkjet Print Cartridge," *Hewlett-Packard Journal*, pp. 6-15, Aug. 1988.
Buskirk, W. et al., "Development of a High-Resolution Thermal Inkjet Printhead," *Hewlett-Packard Journal*, pp. 55-61, Oct. 1988.
Bhaskar, E. et al., "Development of the Thin-Film Structure for the ThinkJet Printhead," *Hewlett-Packard Journal*, pp. 27-32, May 1985.
Klassen, E., et al., "Integrated Thermal-Conductivity Vacuum Sensor," *Sensors and Actuators A* 58, 1997, pp. 37-42.
Muller, R. et al., *Device Electronics for Integrated Circuits 2d ed.*: Silicon Technology, John Wiley & Sons, New York, 1986, p. 96.
Allen et al., "Thermodynamics and Hydrodynamics of Thermal Ink Jets," *Hewlett-Packard Journal*, 36(5):21-27, May 1985.
Kopp et al., "Chemical Amplification: Continuous-Flow PCR on a Chip," *Science*, 280(1046):1046-1048, May 15, 1998.

* cited by examiner

HEATING ELEMENT FOR MICROFLUIDIC AND MICROMECHANICAL APPLICATIONS

CROSS-REFERENCE TO RELATED APPLICATION

This application is a continuation of U.S. patent application Ser. No. 10/029,533, filed Dec. 20, 2001, which application is incorporated herein by reference in its entirety.

BACKGROUND OF THE INVENTION

1. Field of the Invention

The present invention relates to microchip heaters for microfluidic and micromechanical applications, such as integrated chemical microreactors for decomposition and detection of bioorganic compounds such as DNA, ink-jet printer heaters for firing ink for printing purposes, optical switching based on vapor bubble formation to deflect a light beam, and optical switching based on liquid crystals.

2. Description of the Related Art

As is known, some fluids are processed at temperatures that should be regulated in an increasingly more accurate way, for example, when chemical or biochemical reactions are involved. In such situations, there is often also a need to use very small quantities of fluid, owing to the cost of the fluid, or to low availability.

This is the case, for example, of the DNA amplification process (PCR, i.e., Polymerase Chain Reaction process), wherein accurate temperature control in the various steps (repeated pre-determined thermal cycles are carried out), the need to avoid as far as possible thermal gradients where fluids react (to obtain here a uniform temperature), and also reduction of the used fluid (which is very costly), are of importance in obtaining good reaction efficiency, or even to make reaction successful. Microchip heaters are particularly suited for this application.

Other examples of fluid processing with the above-described characteristics are associated for example with implementation of chemical and/or pharmacological analyses, and biological examinations. Other situations that require a miniaturized heater that is one or more of more accurate, quicker reacting, more durable, longer-lived, more controllable and less expensive to manufacture include ink-jet printers heaters and optical switching heaters to name a few.

At present, various techniques allow thermal control of chemical or biochemical reagents. In particular, from the end of the 1980s, miniaturized devices were developed, and thus had a reduced thermal mass, which could reduce the times necessary to complete the DNA amplification process. Recently, monolithic integrated devices of semiconductor material have been proposed, able to process small fluid quantities with a controlled reaction, and at a low cost (see, for example, U.S. patent application Ser. No. 09/779,980, filed on Feb. 8, 2001; Ser. No. 09/874,382 filed on Jun. 4, 2001; and Ser. No. 09/965,128, now issued U.S. Pat. No. 6,710,311; all assigned to STMicroelectronics, S.r.l. and incorporated herein by reference).

These devices comprise a semiconductor material body accommodating buried channels that are connected, via an input trench and an output trench, to an input reservoir and an output reservoir, respectively, to which the fluid to be processed is supplied, and from which the fluid is collected at the end of the reaction. Above the buried channels, heating elements and thermal sensors are provided to control the thermal conditions of the reaction (which generally requires different temperature cycles, with accurate control of the latter), and, in the output reservoir, detection electrodes are provided for examining the reacted fluid. The heat is generated by supplying electric current to a metal heating element formed on a wafer comprising a semiconductor body with contact regions in electrical contact with the two opposite ends of the heating element and connected to a drive transistor, typically a MOSFET formed on the same wafer.

Current inkjet technology relies on placing a small amount of ink within an ink chamber, rapidly heating the ink and ejecting it to provide an ink drop at a selected location on an adjacent surface, such as a sheet of paper. Traditionally, ohmic resistors which heat up rapidly when current is passed therethrough have been used to provide the necessary temperature increase of the ink. See, for example, a detailed discussion of ink ejection in an article titled "Thermodynamics and Hydrodynamics of Thermal Ink Jets," by Allen et al., *Hewlett-Packard Journal*, May 1985, pp. 20-27, incorporated herein by reference.

Microchips are highly suited for miniaturized heater applications. Generally, present techniques for generating local heating in a microchip are based on ohmic resistors made of metal alloys, such as TaA1, HfB, ternary alloys, etc., or polycrystalline semiconductors. The heating resistor is driven by external circuitry or an integrated power MOSFET. In existing applications, such as thermal ink-jet printers, the heating resistor value is preferably higher than the MOSFET channel resistance ($R_{ON}$ or $R_{DS}$) to minimize the parasitic effects and dissipate power in the heating resistor only. Normally, each power MOSFET occupies a large percentage of the chip area to minimize its $R_{ON}$.

One drawback with this arrangement is that the resistance of such ohmic resistors is fixed and cannot be modulated, thus limiting their flexibility. Other drawbacks are that ohmic resistors are subject to material degradation (such as oxidation, segregation, etc.), and electromigration, especially at high temperatures. These phenomena limit their lifetime and are a concern for the reliability of devices that incorporate them into their design.

Yet another drawback is power control. Ohmic resistors, which are either current or voltage driven, dissipate a power that is a quadratic function of the parameters. This results in poor control over their output, as small variations in current or voltage can cause significant fluctuations in power and temperature output.

The present invention provides a miniaturized heater that provides the desired characteristics for many microfluidic and micromechanical applications, while overcoming the drawbacks noted above, while providing other related advantages.

BRIEF SUMMARY OF THE INVENTION

The present invention resides in an integrated heater comprised of a semiconductor material, with at least one transistor formed in the semiconductor material and operable to generate heat, and an object to be heated positioned adjacent to the transistor to receive the heat generated by the transistor. In one embodiment disclosed, the object to be heated is a fluid chamber positioned adjacent to the semiconductor material. The object to be heated may be, but is not limited to, a fluid chamber formed in the semiconductor material.

In some disclosed embodiments, the semiconductor material has a wall portion adjacent to the transistor to transmit heat generated by the transistor through the semiconductor wall portion. The heater further includes a body having wall portion positioned adjacent to and in sealing engagement with the semiconductor wall portion, such that the semiconductor wall portion and the body wall portion together define a fluid chamber as the object to be heated. The object to be heated may take forms other than a fluid chamber.

In some disclosed embodiments, the integrated heater further includes a thermally insulating barrier formed in the semiconductor material extending about the transistor to limit transmission in the semiconductor material of the heat generated by the transistor beyond the insulating barrier.

The heater may be manufactured with the semiconductor material extending laterally beyond the transistor to provide a lateral semiconductor portion, and the object to be heated may be positioned laterally adjacent to the transistor and adjacent to the lateral semiconductor portion to receive the heat generated by the transistor that is transmitted laterally to the lateral semiconductor portion. In at least one such embodiment, the heater has a dielectric layer extending over the semiconductor material with a window formed in a portion of the dielectric layer at a location adjacent to the lateral semiconductor portion, with the object to be heated positioned at the window to receive the heat generated by the transistor which passes through the window. The lateral semiconductor portion may have a wall portion to transmit heat to the object to be heated that is generated by the transistor and transmitted through the lateral semiconductor portion, and the heater may include a body with a wall portion positioned adjacent to and in sealing engagement with the lateral semiconductor wall portion, such that the lateral semiconductor wall portion and the body wall portion together define a fluid chamber as the object to be heated. In this embodiment, the thermally insulating barrier formed in the semiconductor material extends laterally outward of and about the transistor and the lateral semiconductor portion.

The integrated heater may be manufactured using a plurality of transistors formed in the semiconductor material and selectively operable to generate heat.

The integrated heater may be manufactured as a field effect transistor formed in a semiconductor substrate, with the transistor having a source region, a drain region and a channel region between the source and drain regions to conduct electric current, with the channel region having a resistance when conducting current to generate heat above a selected threshold. A dielectric layer is disposed on the channel region. A gate electrode is disposed on the dielectric layer to control the current conducted by the channel region. The object to be heated is positioned to receive the heat generated by the resistance of the channel region.

BRIEF DESCRIPTION OF THE SEVERAL VIEWS OF THE DRAWING(S)

In order to assist understanding of the present invention, preferred embodiments are now described, purely by way of non-limiting example, with reference to the attached drawings, wherein.

Figure 1:
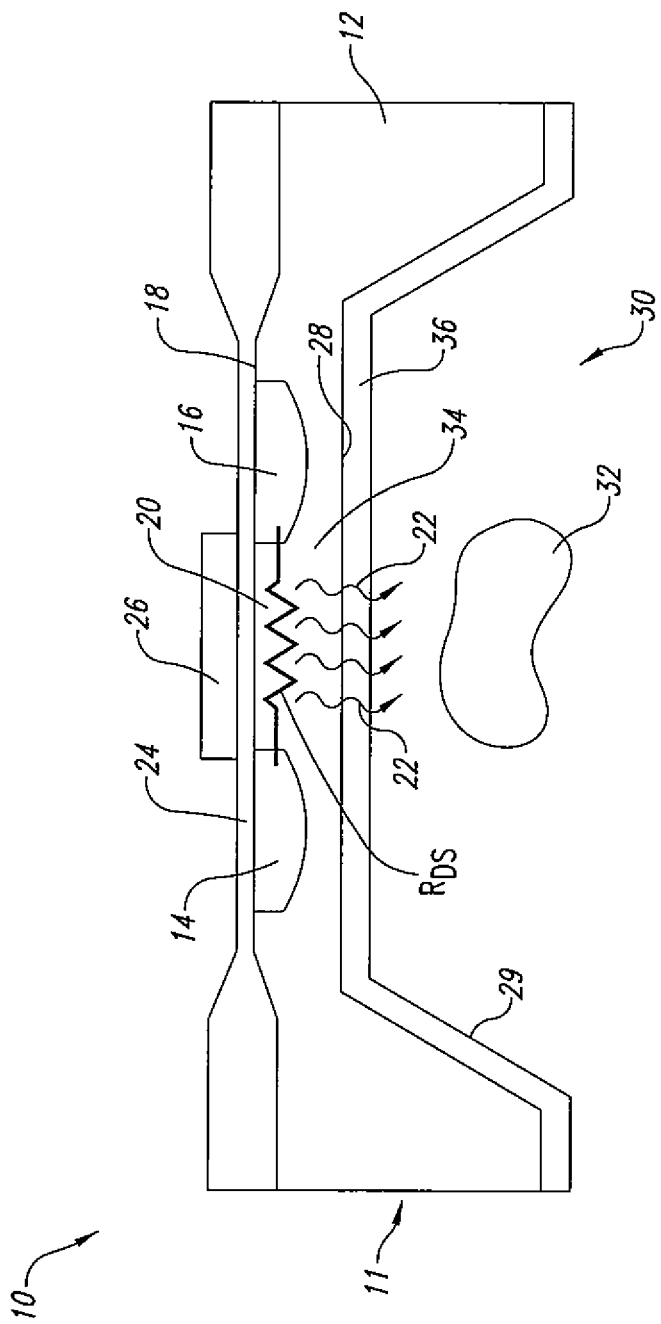
FIG. 1 is a side elevational, cross-sectional schematic drawing of a MOSFET heater according to the invention.
Figure 8:
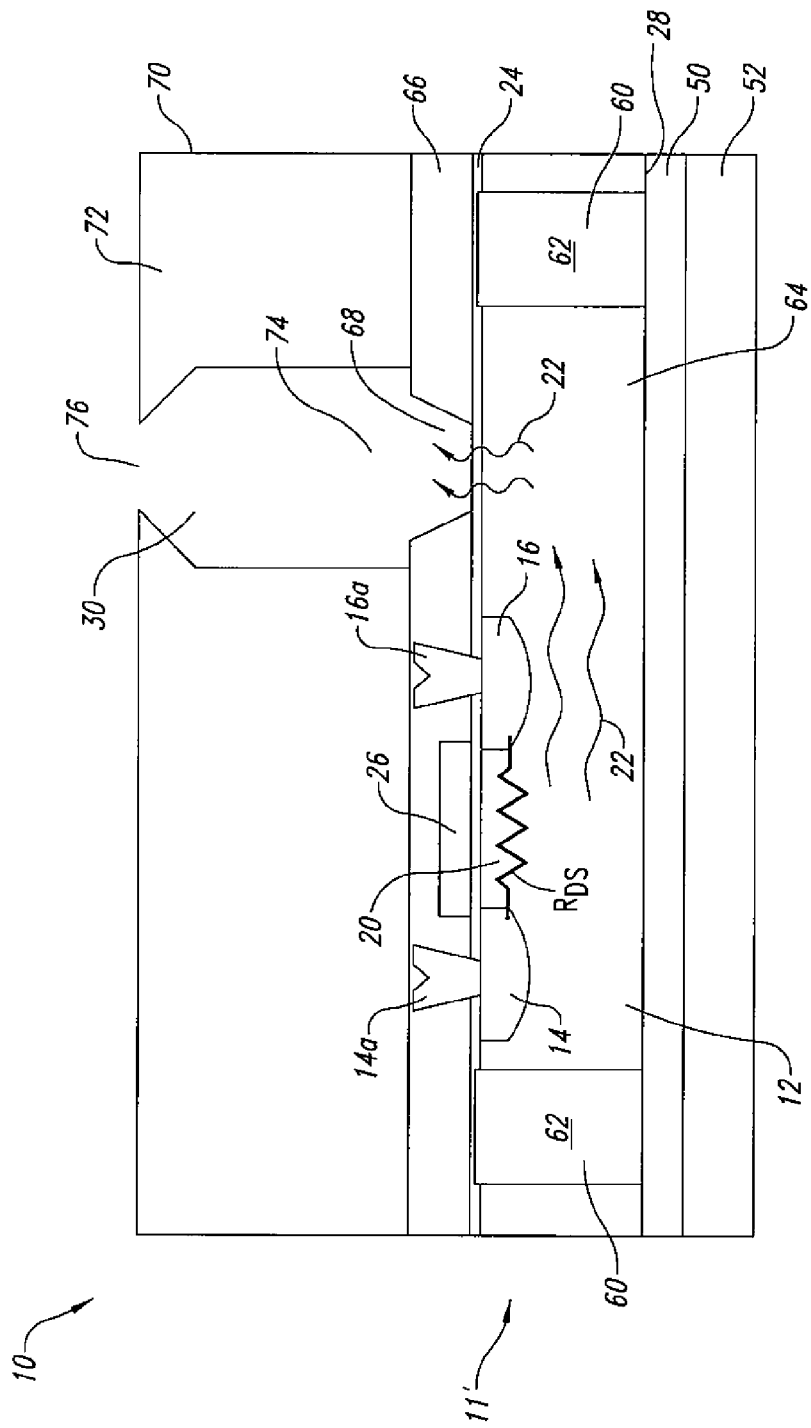
Figure 9:
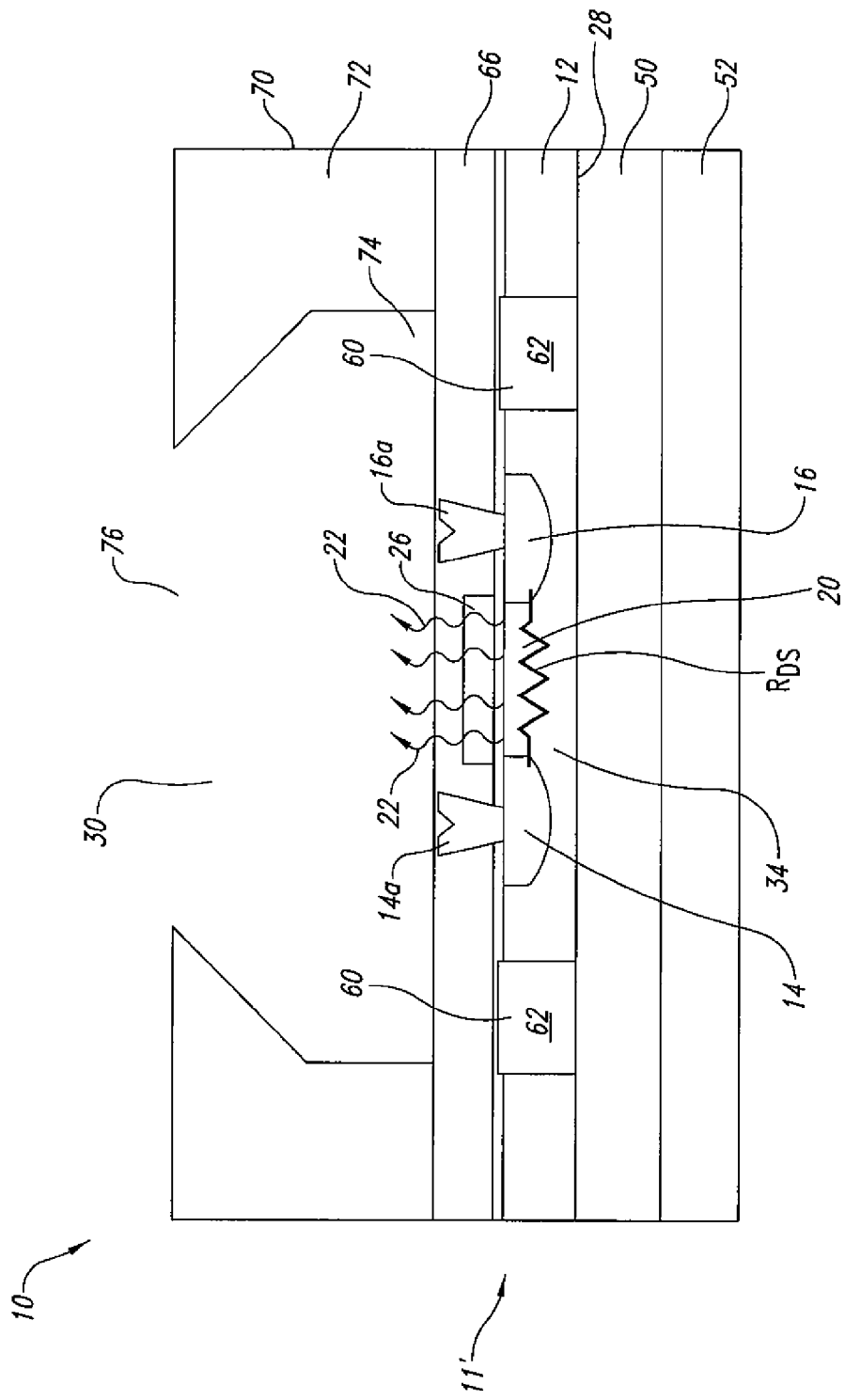

FIG. 8 is a side elevational, cross-sectional schematic drawing of a seventh alternative embodiment of the MOSFET heater of FIG. 1 with a fluid chamber formed laterally offset from the MOSFET and on a front side of the MOSFET; and FIG. 9 is a side elevational, cross-sectional schematic drawing of an eighth alternative embodiment of the MOSFET heater of FIG. 1 with a fluid chamber formed on a front side of the MOSFET immediately thereover and a thermally insulating trench extending about the MOSFET.

DETAILED DESCRIPTION OF THE INVENTION

As shown in the drawings for purposes of illustration, the present invention is embodied in an integrated heater, indicated generally by reference numeral 10, formed on a wafer 11. As shown in FIG. 1, the wafer 11 has a substrate 12 of monocrystalline semiconductor material, for example silicon. The substrate 12 has been processed using well-known MOSFET manufacturing techniques to form a source region 14 and a drain region 16 of a MOSFET in the substrate toward an upper side or surface 18 thereof. A channel region 20 of the MOSFET is formed in the substrate 12 between the source and drain regions 14 and 16 to conduct electric current between the source and drain regions. The channel region 20 has a resistance $R_{ON}$ or $R_{DS}$, indicated schematically by resistor symbol, to electric current so as to generate heat, indicated by arrows 22, when conducting electric current.

A dielectric layer 24, for example an oxide, is formed on the upper side of the substrate 12 and extends across the channel region 20. A gate electrode 26 of the MOSFET is formed on the dielectric layer 24 above the channel region 20 to control the current conducted by the channel region. The gate electrode can be composed of any acceptable material, such as polysilicon, a polysilicon with a silicide layer thereon, or metal or any other conductive layer that is compatible with the process of the present invention. A metal silicide on top of a polysilicon is preferred in many instances because such a gate has a very low electrical resistivity with the advantage of a metal top layer for good thermal conductivity. The process technology and steps for forming such are well known. The MOSFET can be of any suitable type, such as LDMOS, VDMOS, etc.

A lower side or surface 28 of the substrate 12 has a portion thereof below the channel region 20 (at the back of the wafer 11) etched away or otherwise removed to reduce the thickness of the substrate in this area and to form a recess 29 in the substrate. The recess 29 defines at least in part a chamber 30 and serves as the object to be heated by the heat 22 generated by the channel region 20. The chamber 30 may be sized and shaped to receive a substance 32 to which the heat 22 transmitted into the chamber 30 is transferred. The chamber 30 is positioned close to the channel region 20 to receive the heat 22 generated by the channel resistance $R_{DS}$ when the channel region is conducting electric current. The substrate 12 is removed when forming the chamber 30 so as to leave a thinned region or wall portion 34 thereof remaining below the channel region 20 in order to have the heat source (i.e., the channel region) close to the substance 32 to be heated.

The lower side 28 of the substrate 12 has dielectric layer 36 formed thereon, such as by deposition or by being grown thereon. The dielectric layer 36 lines the portion of the lower side of the substrate that forms a part of the chamber 30. If the substance 32 to be received in the chamber 30 for heating is a fluid, the dielectric layer 36 may be selected as a material that provides protection to the substrate 12 against any harmful effects the fluid may have on the substrate if direct contact occurred. In the case of a fluid, the fluid in the chamber 30 can come into direct contact with the chamber walls and such is desirable to get the fluid close to the channel region 20 to have improved transfer of heat to the fluid. The heat 22 is transmitted through the dielectric layer 36 to the chamber 30 so the dielectric layer is selected with thermal properties sufficient to transfer the desired amount of heat. The heater 10 may be used to heat substances other than fluids, in which case the lower side 28 of the substrate 12 may be used as a heat transfer surface and shaped as appropriate to contact the object to be heated, whether it be a flat object or a contoured object, with or without an intervening protective or other layer or other material.

As noted, the channel resistance $R_{DS}$ (i.e., source-to-drain resistance) of the channel region 20 generates the heat 22 and transfers that heat to the chamber 30 where the substance 32 is at least temporarily located so as to be heated. The channel region 20 generates the heat 22 when a sufficient voltage is applied to the gate electrode 26 to cause conduction in the channel region 20 between the source and drain regions 14 and 16, in a manner conventional with MOSFETs. The amount of heat 22 generated in a particular application can be controlled by the amount of voltage applied to the gate electrode 26 since the channel resistance $R_{DS}$ in a MOSFET is a function of the gate voltage applied. A power MOSFET transistor can be used to achieve higher current conduction and an increased heating rating.

The channel resistance $R_{DS}$ of the channel region 20 can be easily selected during fabrication of the MOSFET to produce a particular resistance value desired for a specific application, such as by varying the length and/or width of the channel region, the silicon doping used and/or the design layout so that the desired power is dissipated through the channel resistance $R_{DS}$ when the MOSFET is on. It is noted that more normally doping of the channel region 20 is done in normal MOSFET production for the purpose of reducing the channel resistance, however, when the MOSFET is used as a heater, the doping is conducted to enhance/increase the resistance of the channel. A particular channel resistance $R_{DS}$ is selected such that when the channel region 20 is conducting electric current, heat above a selected threshold is generated and transferred to the chamber 30 to heat the substance 32 in the chamber. The threshold is selected to supply the amount of heat desired to be transferred to the object to be heated or necessary to raise the temperature of the object to be heated or a substance to at least a desired temperature.

The MOSFET used in the heater 10 may be fabricated using conventional techniques to produce a channel resistance $R_{DS}$ that may be from a few ohms to thousands of ohms, thus providing design flexibility. The operating temperature range of the channel resistance $R_{DS}$ of the MOSFET can be between a few Celsius degrees and more than 1,000 Celsius degrees, thus providing sufficient heat for many microfluidic and micromechanical applications where local thermal gradients are required, such as to induce chemical reactions, or to produce mass and heat transportation such as to eject fluids or generate vapors. The substance 32 to which the heat 22 transmitted into the chamber 30 is transferred may be a fluid such as, but not limited to, ink, mixtures of organic materials, fluids for optical switching, and gases for environmental testing and medical applications, and the fluids mentioned in the Description of the Related Arts set forth herein, to name a few.

The heater 10 may be made easier and less expensively than known microchip heaters using ohmic resistors. Fewer mask processing steps are required and the expensive process control need to deposit and etch exotic resistor layers is eliminated. No expensive or exotic materials need be used. This results in simplified processing and less expense to fabricate the heater 10. Further, the cost is reduced since significant chip size reduction is achieved by the fact that the heater 10 does not require separate driving transistor and ohmic resistor assemblies be fabricated, both the driving transistor and the resistive element are combined together as the same element in the heater 10.

Increased reliability of performance for many applications will also be achieved using the heater 10. The resistors currently used for inkjet and optical switching applications have limited lifetime and fail for electromigration or physical damage (such as from cavitation) after a few billions of cycles. The lifetime of the channel region 20 of the heater 10 functioning to provide the channel resistance $R_{DS}$ that produces the heat 22 should last for several years of operating conditions, which for inkjet printer applications is longer than the life of the printer. This is because the channel resistance $R_{DS}$ is made from durable silicon crystal. This should allow the manufacture of inkjet printheads that are cheap and permanent, and do not need replacement during the normal lifetime of the inkjet printer.

The performance will also be increased for many applications when using the heater 10. This is in part due to the drastic reduction of parasitic resistance that is associated with the prior art microchip heaters using ohmic resistors. In the past when using prior art microchip heaters using ohmic resistors, the channel resistance of the driving MOSFET was a main contributor to the parasitic resistance realized, in addition to the parasitic resistance of the metal traces that drive the transistor. With the heater 10, the "parasitic resistance" of the MOSFET becomes the heating element and parasitic effects are now primarily the low resistance metal traces that drive the MOSFET of the heater.

Another performance increase is achieved because the MOSFET transistor used in the heater 10 can be drawn as small as a few squared microns, thus allowing packing of a huge number of transistors on the same chip. For inkjet printers applications, this means that printheads can be manufactured which are capable of printing very high resolution pictures in one single pass.

Yet another performance increase results from the fact that a power MOSFET can be designed in such a way that at operational current/voltage, any fluctuation in these parameters has an insignificant impact on the dissipated power. Thus, the heater 10 is of particular interest for microreactor applications, such as chips for biological analysis, where lower temperatures and good temperature control are needed.

Figure 2:
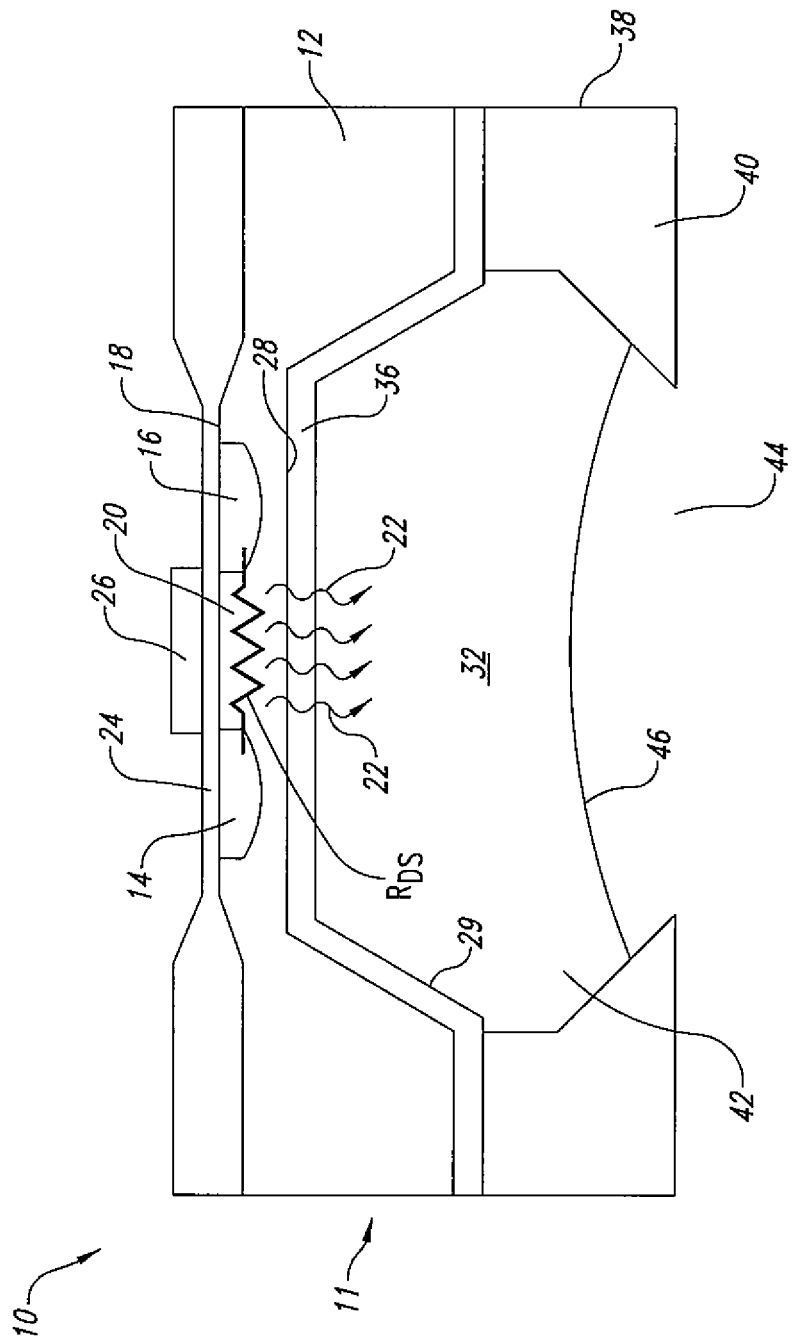
FIG. 2 is a side elevational, cross-sectional schematic drawing of a first alternative embodiment of the MOSFET heater of FIG. 1 with a fluid chamber.

A first alternative embodiment of the heater 10 is shown in FIG. 2. The heater 10 of FIG. 2 has the same basic construction as the heater of FIG. 1 except that the chamber 30 is in part formed by a body 38 that has a wall portion 40 that extends about the recess 29 in the substrate 12 on the back of the wafer 11. The wall portion 40 of the body 38 is positioned adjacent to and in sealing engagement with the substrate 12 at its lower side 28, with the dielectric layer 36 positioned therebetween. The wall portion 40 defines an open interior portion 42 that mates with the recess 29 to form the chamber 30, and defines an orifice 44 through which the substance 32 can pass, which in FIG. 2 is shown as a fluid with a meniscus 46.

Figure 3:
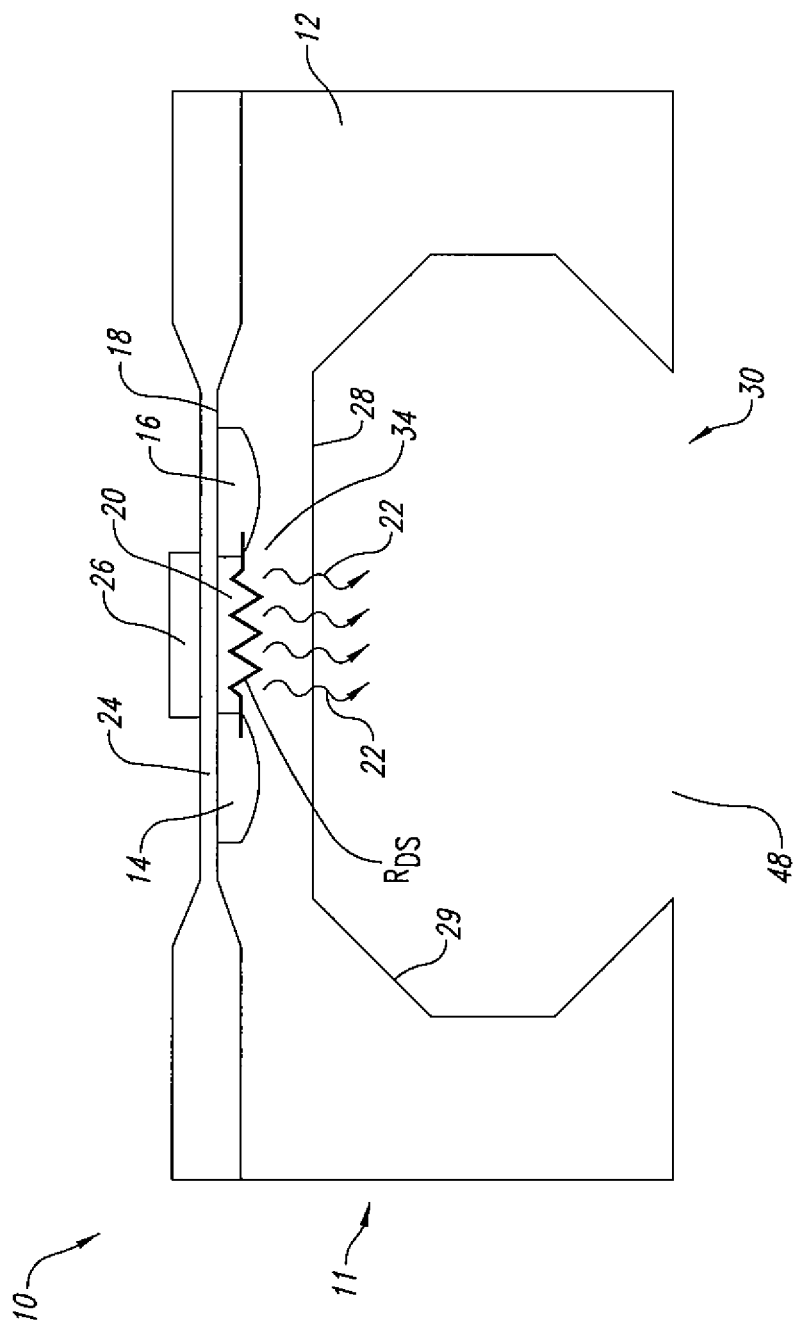
FIG. 3 is a side elevational, cross-sectional schematic drawing of a second alternative embodiment of the MOSFET heater of FIG. 1 with a fluid chamber formed fully in the semiconductor material.

A second alternative embodiment of the heater 10 is shown in FIG. 3. The heater 10 of FIG. 3 has the same basic construction as the heater of FIGS. 1 and 2 except that the recess 29 formed in the substrate 12 on the back of the wafer 11 is shaped to form the entire chamber 30, including an orifice 48. If appropriate, the chamber 30 can be lined with a protective layer.

Figure 4:
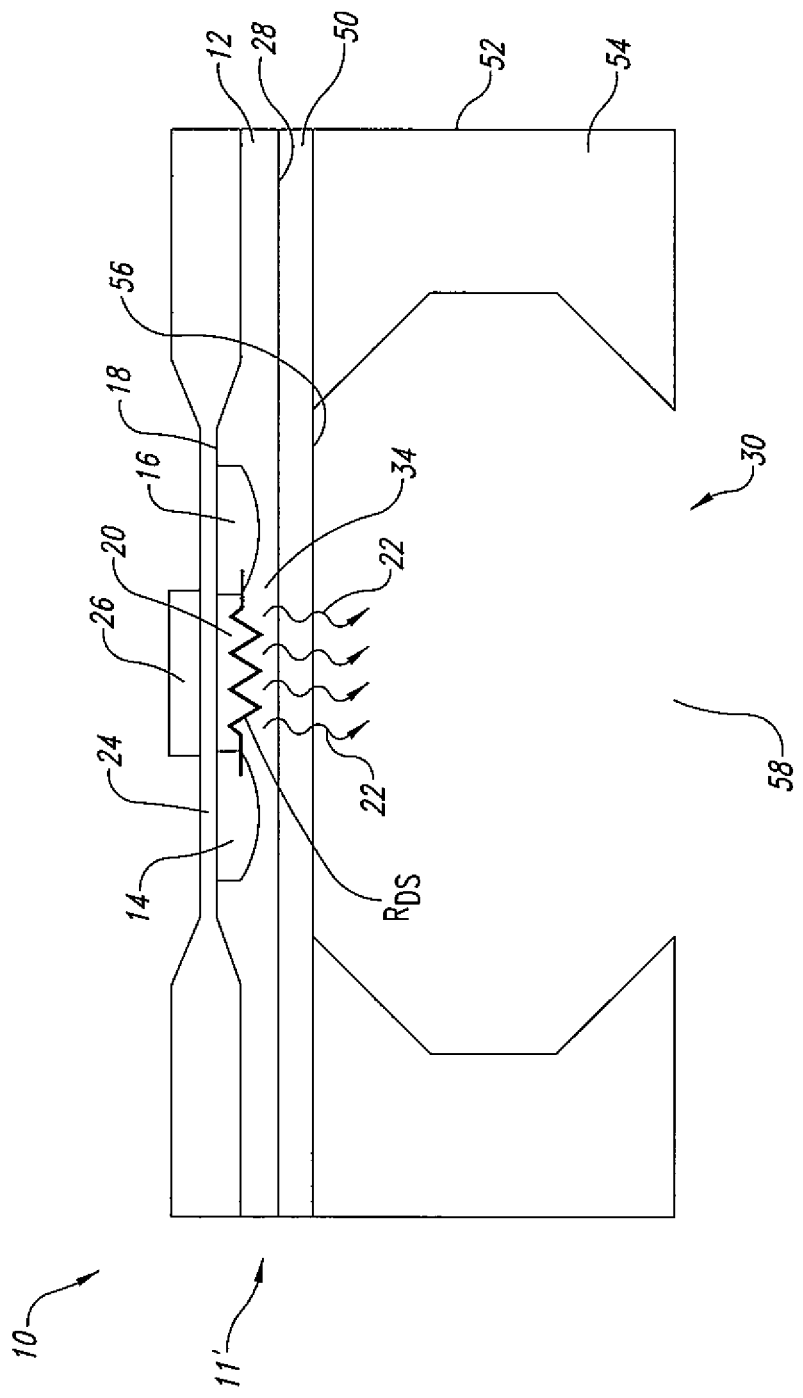
FIG. 4 is a side elevational, cross-sectional schematic drawing of a third alternative embodiment of the MOSFET heater of FIG. 1 with a fluid chamber.

A third alternative embodiment of the heater 10 is shown in FIG. 4. The heater 10 of FIG. 4 has a different construction than the heaters of FIGS. 1-3 in that the MOSFET is made on a SOI (silicon on insulator) wafer 11' with the substrate 12 (such as silicon) having its lower side 28 engaging an oxide layer 50. The heat 22 generated by the channel region 20 is transmitted through the oxide layer 50 to the chamber 30 so the oxide layer 50 is selected with thermal conduction properties sufficient to transfer the desired amount of heat to the chamber. The structure of FIG. 4 can be obtained by using two separate wafers, one for the heating device and one for the chamber 30. The substrate for the chamber 30 can be any acceptable material for the chamber, including silicon, an organic polymer, sapphire, or any other suitable material. The oxide layer 50 is grown thereon, the back side of the substrate 12 is removed to a desired level and the wafer 11' is connected to the substrate 12. There are many acceptable techniques for doing this, one of which is described in application Ser. No. 10/037,484, now issued U.S. Pat. No. 6,689,627, incorporated herein by reference.

In this third alternative embodiment, a body 52 made of silicon with a wall portion 54 defines the chamber 30 in conjunction with a lower side 56 of the oxide layer 50. The wall portion 54 of the body 52 is positioned adjacent to and in sealing engagement with the lower side 56 of the oxide layer 50. The wall portion 54 defines an orifice 58 through which the substance 32 can pass (not shown in FIG. 4).

Figure 5:
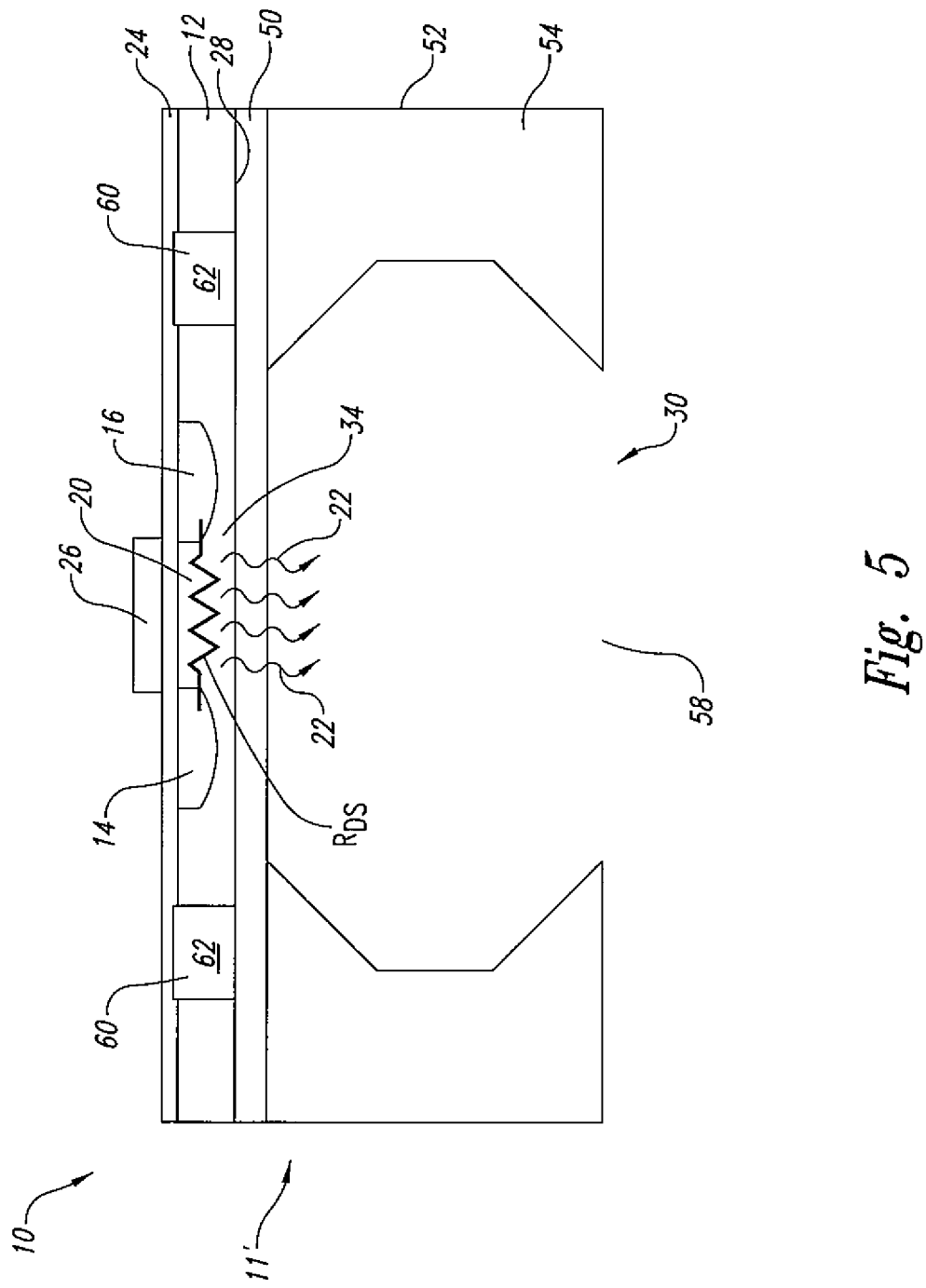
FIG. 5 is a side elevational, cross-sectional schematic drawing of a fourth alternative embodiment of the MOSFET heater of FIG. 1 with a fluid chamber and a thermally insulating trench extending about the MOSFET.

A fourth alternative embodiment of the heater 10 is shown in FIG. 5. The heater 10 of FIG. 5 has the same basic construction as the heater of FIG. 4, using the SOI wafer 11' approach, except that a trench 60 is formed in the substrate 12 which is located laterally outward of and extends fully about the source and drain regions 14 and 16 and channel region 20. The trench 60 may be left empty or filled with an insulating material 62 such as silicon oxide. The trench 60 serves as a thermally insulating barrier to limit the lateral transfer of the heat 22 generated by the channel region 20 in the substrate 12, and as will be described below in greater detail, tends to contain the heat generated by the channel region and allow it to better route the heat to the object to be heated. The trench 60 also serves to electrically isolate the MOSFET. The trench 60 projects fully between the dielectric layer 24 and the oxide layer 50.

Figure 6:
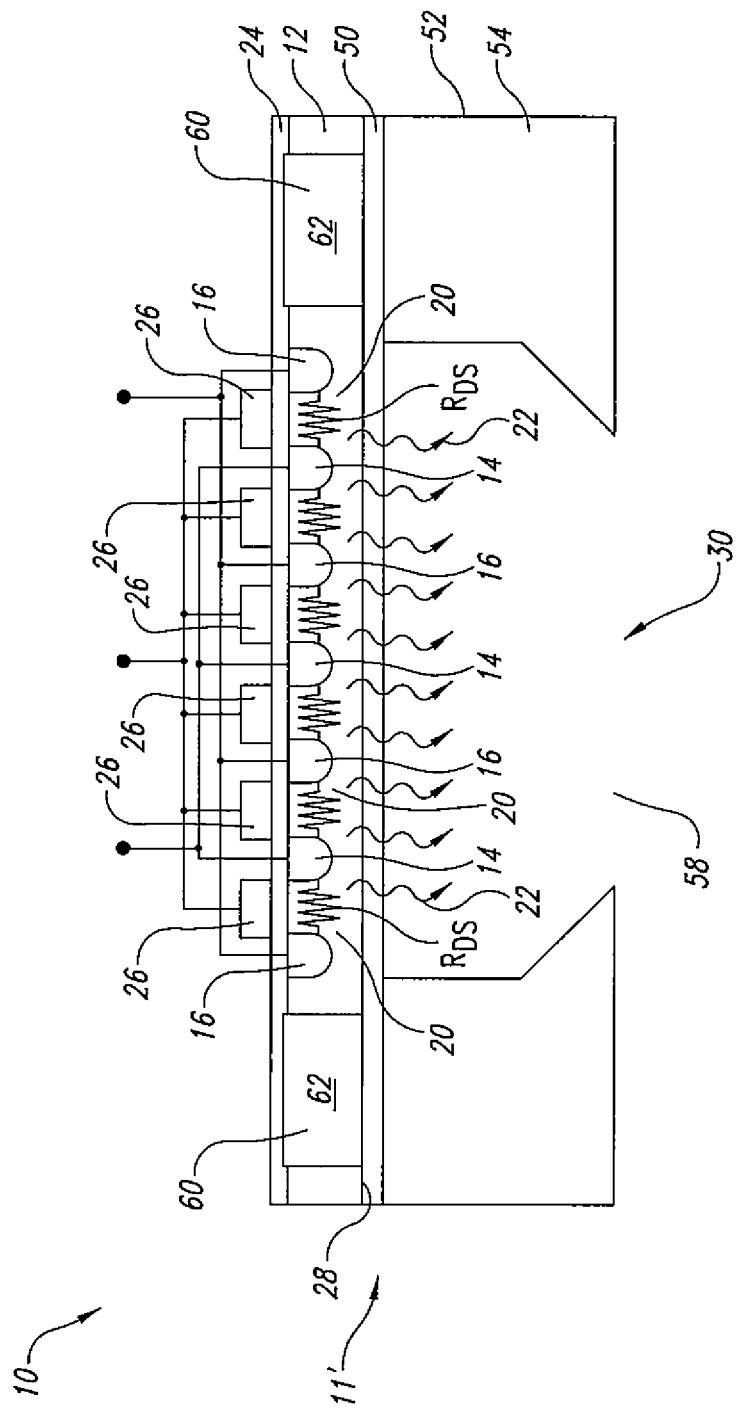
FIG. 6 is a side elevational, cross-sectional schematic drawing of a fifth alternative embodiment of the MOSFET heater of FIG. 1 with a fluid chamber using a multiple source/drain MOSFET and a thermally insulating trench extending about the MOSFET.

A fifth alternative embodiment of the heater 10 is shown in FIG. 6. The heater 10 of FIG. 6 has the same basic SOI construction as the heater of FIG. 5 except that it uses a multiple finger, power MOSFET with multiple source regions 14 electrically connected together, multiple drain regions 16 electrically connected together, and multiple gate electrodes 26 electrically connected together. There are, of course, multiple channel regions 20 between the adjacent source and drain regions. The trench 60 is located laterally outward of and extends fully about all of the source and drain regions 14 and 16 and channel regions 20 for the power MOSFET.

Figure 7:
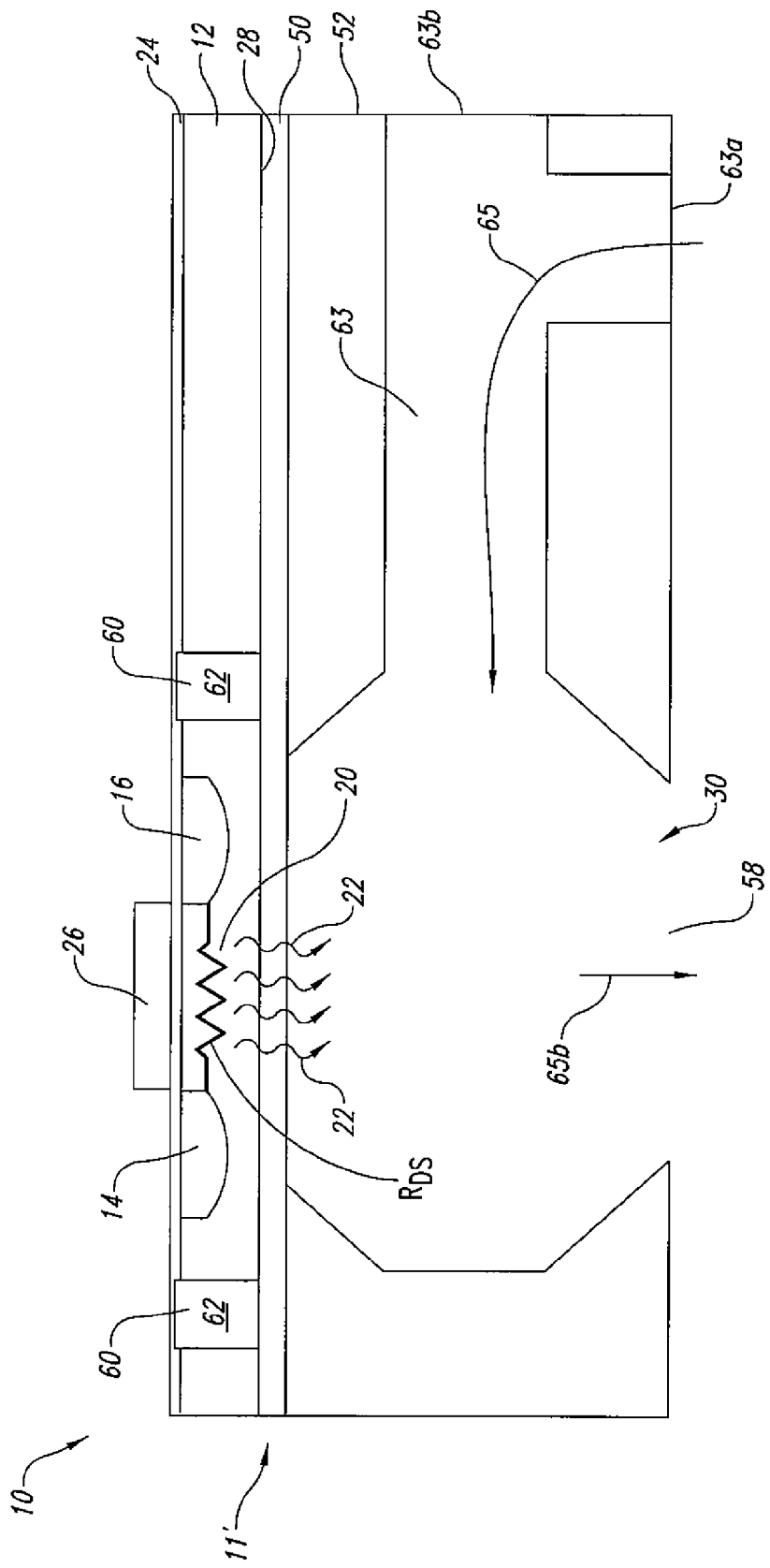
FIG. 7 is a side elevational, cross-sectional schematic drawing of a sixth alternative embodiment of the MOSFET heater of FIG. 1 with a fluid chamber fed by a channel and a thermally insulating trench extending about the MOSFET.

A sixth alternative embodiment of the heater 10 is shown in FIG. 7. The heater 10 of FIG. 7 has the same basic SOI construction as the heater of FIG. 5 except that the substrate 12 and the body 52 extend laterally beyond the source and drain regions 14 and 16, the gate electrode 26 and the channel region 20, and a fluid channel 63 is provided in the body 52 which extends between a channel entrance aperture 63a and the chamber 30. A fluid flow, shown by arrow 65a, may enter the entrance aperture 63a and flow to the chamber 30 whereat the heat 22 generated by the channel region 20 is transferred to the fluid. The heated fluid can then exit the chamber 30 through the orifice 58, shown by arrow 65b. If the heater 10 is used as an inkjet printhead, the exiting heated fluid ink can be sprayed onto the paper or other material to be printed. The fluid channel 63 may also have an additional entrance aperture 63b in fluid communication with the channels of neighboring heaters, if desired.

A seventh alternative embodiment of the heater 10 is shown in FIG. 8. The heater 10 of FIG. 8 uses the same basic SOI construction; however, there is no chamber formed by the silicon body 52, which is a slab in this embodiment. Further, the chamber 30 is not located directly below the channel region 20 to receive the heat 22 generated thereby. Instead, the chamber 30 is located on the front of the wafer 11' and is laterally offset from the MOSFET, as will be described below.

In particular, the substrate 12 has a lateral portion 64 that extends laterally beyond the source and drain regions 14 and 16, the gate electrode 26 and the channel region 20. The heat 22 generated by the channel region 20 is transmitted laterally to the lateral substrate portion 64. In this seventh alternative embodiment, the oxide layer 50 is selected with thermal insulating properties and thickness to limit the amount of the heat 22 generated by the channel region 20 that is transferred through the oxide layer 50, i.e., the oxide layer 50 serves as a thermal barrier. The insulating oxide layer 50, in conjunction with the trench 60, serve as thermally insulating barriers to limit the transmission of the heat 22 generated by the channel region 20 other than in the lateral direction to the lateral substrate portion 64, thus containing the heat generated by the channel region and allowing it to better route the heat to the object to be heated.

In this seventh alternative embodiment of FIG. 8, the dielectric layer 24 extends laterally over the lateral substrate portion 64, and an overlay dielectric layer 66 extends over the dielectric layer 50. The overlay dielectric layer 66 is selected with thermal insulating properties to limit the amount of the heat 22 generated by the channel region 20 that is transferred therethrough, and for passivation to protect the gate electrode 26 and the contacts 14a and 16a used for the source and drain regions 14 and 16. A window 68 is formed in the overlay dielectric layer 66 at a location laterally offset from the MOSFET and corresponding to the lateral substrate portion 64. A body 70 made of silicon with a wall portion 72 defines the chamber 30 with an inward opening 74 and an orifice 76 through which the substance 32 can pass, such as a fluid. The wall portion 72 of the body 70 is positioned adjacent to and in sealing engagement with the overlay dielectric layer 66, with the inward opening 74 of the chamber 30 in alignment with the window 68 so that the heat 22 generated by the channel region 20, which is transmitted laterally through the lateral substrate portion 64, will pass through the window and into the chamber.

An eighth alternative embodiment of the heater 10 is shown in FIG. 9. The heater 10 of FIG. 9 has the same basic construction as the heater of FIG. 8 and has the chamber 30 located on the front of the wafer 11'. However, instead of the substrate 12 and the body 52 extending laterally and providing a window in the overlay dielectric layer 66, in this eighth alternative embodiment the chamber 30 formed by the wall portion 72 of the body 70 has the inward opening 74 positioned immediately over the MOSFET. Further, the inward opening 74 is sized sufficiently large, in the lateral direction, to span the source and drain regions 14 and 16, the gate electrode 26, and the channel region 20, and terminates above the trench 60, formed in the substrate 12, which is located laterally outward of and extends fully about the source and drain regions 14 and 16 and channel region 20. In such manner, the heat 22 generated by the channel region 20 is thermally blocked by the oxide layer 50 and the trench 60, and thus contained within the wall portion 34 of the substrates 2 inward of the oxide layer 50 and the trench 60, and transmitted through the gate electrode 26 and the overlay dielectric layer 66 around the gate electrode. The heat 22 is then passed through the inward opening 74 and into the chamber 30. In this embodiment, the overlay dielectric layer 66 is selected with thermal properties that allow a sufficient amount of the heat 22 generated by the channel region 20 to be transferred through the overlay dielectric layer to supply the desired heat to the chamber 30, and to whatever substance may be therein.

To improve the efficiency of the heater 10, the gate electrode 26 used in this eighth alternative embodiment may be fabricated using a material that provides a desired thermal conductivity for the application for which the heater is to be used. Also, the gate material may be selected to provide a long mechanical life. In an inkjet printhead, a material can be selected for the gate electrode 26 that can withstand the high pressures encountered with heated ink, and the cavitation effect that is so damaging to prior art inkjet printhead components. The gate material can also be selected to avoid damage that might come from contact of the fluid with the gate electrode 26, should such occur. A metal, such as tantalum, tantalum alloy, aluminum and aluminum alloy are acceptable for the gate electrode 26. In this invention, it may be desirable to use a metal gate electrode and have the appropriate thickness gate dielectric, whether an oxide or nitride or sandwich thereof, to provide reliable, long-term operation for many applications.

The wafer 11 or 11' on which the heater 10, or more likely many heaters of the design desired for the application, are formed may also contain MOSFETs or other circuitry that serves to control the heater MOSFETs as well as perform other functions. By putting the heater MOSFETs and the other MOSFETs on the same wafer or chip that is produced therefrom, cost savings and size advantages can be achieved. In such an arrangement, the heater MOSFETs and the other MOSFETs would be geometrically isolated from each other sufficiently that the channel regions of the two types of MOSFETs can be processed differently, with the channel region 20 of the heater MOSFETs being fabricated to enhance its channel resistance $R_{DS}$ so as to produced the desired heat.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An integrated heater comprising:
   a semiconductor material substrate;
   at least one transistor formed in the semiconductor material substrate and operable to generate heat above a selected threshold, the transistor having a channel region with a resistance value function selected during fabrication to cause the heat generated during operation to be above the selected threshold; and
   a thermally insulating barrier formed in the semiconductor material substrate and positioned to limit transfer of heat within the semiconductor material substrate.

2. The integrated heater of claim 1 wherein the thermally insulating barrier extends fully about the transistor.

3. The integrated heater of claim 1 wherein the thermally insulating barrier projects fully through a thickness of the semiconductor material substrate.

4. The integrated heater of claim 1 wherein the thermally insulating barrier comprises a trench formed in the semiconductor material substrate.

5. The integrated heater of claim 4 wherein the thermally insulating barrier comprises insulating material deposited in the trench.

6. The integrated heater of claim 1, comprising a thermally insulating layer formed on the semiconductor material substrate.

7. The integrated heater of claim 1, comprising an object to be heated positioned so as to receive heat generated by the transistor.

8. The integrated heater of claim 7 wherein the object to be heated is a fluid chamber.

9. The integrated heater of claim 8 wherein the fluid chamber is formed in the semiconductor material substrate.

10. The integrated heater of claim 8 wherein the semiconductor material substrate has a thinned region adjacent to the transistor.

11. The integrated heater of claim 8, comprising a dielectric layer extending between the semiconductor material substrate and the fluid chamber.

12. The integrated heater of claim 8, comprising a body positioned on the semiconductor material substrate, the body having a wall portion that defines, with a portion of the substrate, the fluid chamber.

13. The integrated heater of claim 12, comprising a thermally insulating layer positioned between the semiconductor material substrate and the body and having a window in a position corresponding to the fluid chamber.

14. The integrated heater of claim 13 wherein the thermally insulating barrier extends in the semiconductor material substrate fully about the transistor and the window.

15. The integrated heater of claim 13 wherein the window and the fluid chamber are positioned to one side of the transistor.

16. The integrated heater of claim 8, comprising a thermally insulating layer positioned on a side of the semiconductor material substrate opposite the fluid chamber.

17. The integrated heater of claim 1 wherein the transistor is a multiple finger power MOSFET transistor.

18. An integrated heater comprising:
    a semiconductor material substrate;
    a plurality of transistors formed in the semiconductor material substrate and selectively operable to generate heat, each of the transistors having a channel region with a resistance value function selected during fabrication to cause the heat generated during operation to be above the selected threshold;
    a thermal insulation barrier formed in the semiconductor material substrate and extending fully about at least one of the transistors; and
    an object to be heated positioned so as to receive heat generated by the transistors.

19. The integrated heater of claim 18 wherein the object to be heated is a fluid chamber positioned adjacent to the semiconductor material substrate.

20. The integrated heater of claim 18 wherein the transistors of the plurality of transistors are connected so as to form a multiple finger power transistor.

21. An integrated heater comprising:
a semiconductor material substrate;
at least one transistor formed in the semiconductor material substrate and operable to generate heat above a selected threshold, the transistor having a channel region with a resistance value function selected during fabrication to cause the heat generated during operation to be above the selected threshold; and
a thermal insulation barrier including insulating material deposited in a trench formed in the semiconductor material substrate and positioned to limit transfer of heat within the semiconductor material substrate.

22. The integrated heater of claim 21, comprising a thermally insulating layer formed on the semiconductor material substrate.

23. The integrated heater of claim 21, comprising an object to be heated positioned so as to receive heat generated by the transistor.

24. An integrated heater comprising:
a semiconductor material substrate;
at least one transistor formed in the semiconductor material substrate and operable to generate heat above a selected threshold, the transistor having a channel region with a resistance value function selected during fabrication to cause the heat generated during operation to be above the selected threshold;
a thermally insulating barrier formed in the semiconductor material substrate and positioned to limit transfer of heat within the semiconductor material substrate; and
a fluid chamber formed in the semiconductor material substrate and positioned so as to receive heat generated by the transistor.

25. An integrated heater comprising:
a semiconductor material substrate;
at least one transistor formed in the semiconductor material substrate and operable to generate heat above a selected threshold, the semiconductor material substrate having a thinned region adjacent to the transistor, the transistor having a channel region with a resistance value function selected during fabrication to cause the heat generated during operation to be above the selected threshold; and
a thermally insulating barrier formed in the semiconductor material substrate and positioned to limit transfer of heat within the semiconductor material substrate.

26. An integrated heater comprising:
a semiconductor material substrate;
at least one transistor formed in the semiconductor material substrate and operable to generate heat above a selected threshold, the transistor having a channel region with a resistance value function selected during fabrication to cause the heat generated during operation to be above the selected threshold;
a thermally insulating barrier formed in the semiconductor material substrate and positioned to limit transfer of heat within the semiconductor material substrate;
a fluid chamber positioned so as to receive heat generated by the transistor; and
a dielectric layer extending between the semiconductor material substrate and the fluid chamber.

27. An integrated heater comprising:
a semiconductor material substrate;
at least one transistor formed in the semiconductor material substrate and operable to generate heat above a selected threshold, the transistor having a channel region with a resistance value function selected during fabrication to cause the heat generated during operation to be above the selected threshold;
a thermally insulating barrier formed in the semiconductor material substrate and positioned to limit transfer of heat within the semiconductor material substrate;
a body positioned on the semiconductor material substrate, the body having a wall portion that defines, with a portion of the substrate, the fluid chamber; and
a thermally insulating layer positioned between the semiconductor material substrate and the body and having a window in a position corresponding to the fluid chamber.

28. The integrated heater of claim 27 wherein the thermally insulating barrier extends in the semiconductor material substrate fully about the transistor and the window.

29. The integrated heater of claim 27 wherein the window and the fluid chamber are positioned to one side of the transistor.

30. An integrated heater comprising:
a semiconductor material substrate;
a multiple finger power MOSFET transistor formed in the semiconductor material substrate and operable to generate heat above a selected threshold, the transistor having a channel region with a resistance value function selected during fabrication to cause the heat generated during operation to be above the selected threshold; and
a thermally insulating barrier formed in the semiconductor material substrate and positioned to limit transfer of heat within the semiconductor material substrate.

* * * * *